United States Patent
Ikeuchi

(10) Patent No.: US 9,641,151 B2
(45) Date of Patent: May 2, 2017

(54) ELASTIC WAVE FILTERS AND DUPLEXERS USING SAME

(71) Applicant: SKYWORKS FILTER SOLUTIONS JAPAN CO., LTD., Kadoma-shi (JP)

(72) Inventor: Satoru Ikeuchi, Hyogo-ken (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 14/810,165

(22) Filed: Jul. 27, 2015

(65) Prior Publication Data
US 2016/0036415 A1    Feb. 4, 2016

Related U.S. Application Data

(63) Continuation of application No. PCT/JP2015/003605, filed on Jul. 17, 2015.

(30) Foreign Application Priority Data

Jul. 31, 2014  (JP) ................................. 2014-155796

(51) Int. Cl.
*H03H 9/64* (2006.01)
*H03H 9/72* (2006.01)
*H03H 9/02* (2006.01)

(52) U.S. Cl.
CPC .... *H03H 9/02559* (2013.01); *H03H 9/02834* (2013.01); *H03H 9/6483* (2013.01); *H03H 9/725* (2013.01)

(58) Field of Classification Search
CPC ........... H03H 9/02543; H03H 9/02559; H03H 9/02834; H03H 9/6406; H03H 9/6483; H03H 9/725

USPC .......................................... 333/133, 193–196
See application file for complete search history.

(56) References Cited

U.S. PATENT DOCUMENTS

| 6,710,514 B2 * | 3/2004 | Ikada ....................... H03H 3/08 310/313 B |
| 2008/0074212 A1 | 3/2008 | Matsuda et al. |
| 2012/0086521 A1 | 4/2012 | Tsurunari et al. |
| 2013/0127566 A1 | 5/2013 | Iwaki et al. |

(Continued)

FOREIGN PATENT DOCUMENTS

| WO | WO 2012/176455 | * 12/2012 |
| WO | 2013080461 A1 | 6/2013 |

OTHER PUBLICATIONS

International Search Report and Written Opinion from corresponding International Application No. PCT/JP2015/003605 dated Jan. 12, 2016.

*Primary Examiner* — Barbara Summons
(74) *Attorney, Agent, or Firm* — Lando & Anastasi, LLP

(57) ABSTRACT

An elastic wave filter including a substrate, a signal line disposed on the substrate and connecting a first signal terminal to a second signal terminal, a plurality of series resonators connected to the signal line in series, and a plurality of parallel resonators connected to the signal line. At least one of the series resonator having an anti-resonant frequency closest to the passband of the filter among the plurality of series resonators, and/or the parallel resonator having a resonant frequency closest to the passband of the filter among the plurality of parallel resonators, is covered with a dielectric film that is relatively thicker than a dielectric film covering the other series and/or parallel resonators.

18 Claims, 5 Drawing Sheets

(56) References Cited

U.S. PATENT DOCUMENTS

2013/0162368 A1   6/2013  Tsurunari et al.
2013/0300519 A1* 11/2013  Tamasaki ........... H03H 9/02559
                                              333/133

* cited by examiner

ELASTIC WAVE FILTERS AND DUPLEXERS USING SAME

CROSS REFERENCE TO RELATED APPLICATIONS

This application claims the benefit of priority under 35 U.S.C. §119 and PCT Article 8 to co-pending JP Patent Application No. 2014-155796 filed on Jul. 31, 2014, which is incorporated herein by reference in its entirety for all purposes. This application also claims priority under 35 U.S.C. §120 to co-pending International Application No. PCT/JP2015/003605 filed on Jul. 17, 2015, which is herein incorporated by reference in its entirety for all purposes.

BACKGROUND

Field of Invention

Aspects and embodiments relate generally to an elastic wave filter that can be used in various electronic devices, and a duplexer using the same.

Discussion of Related Art

Elastic wave filters are conventionally used as branching filters or high frequency filters in wireless communication devices. In addition, duplexers including an elastic wave filter are well known. U.S. Patent Application Publication No. 2012/086521 describes examples of a ladder type surface acoustic wave filter and duplexers using the same.

SUMMARY OF INVENTION

In certain conventional elastic wave filters, the interdigital transducer (IDT) electrode is covered with a dielectric film to suppress fluctuations in the frequency characteristic caused by temperature changes. However, this dielectric film can undesirably lower the electromechanical coupling coefficient of the elastic wave filter.

Aspects and embodiments are directed to providing an elastic wave filter having an improved electromechanical coupling coefficient to allow broadband operation, while also having reduced fluctuations in the passing characteristic due to temperature changes.

According to certain embodiments, an elastic wave filter includes a substrate, a signal line provided above the substrate and connecting a first signal terminal to a second signal terminal, a series resonator connected to the signal line in series, and parallel resonators connected to the signal line in parallel. The parallel resonators include first and second parallel resonators each of which has an IDT electrode and a dielectric film covering the IDT electrode, the first parallel resonator being configured to have a resonant frequency closer to a passband of the elastic wave filter than that of the second parallel resonator, and a dielectric film covering the first parallel resonator being configured to have a film thickness greater than that of a dielectric film covering the second parallel resonator.

Further embodiments of an elastic wave filter include a substrate, a signal line provided above the substrate and connecting a first signal terminal to a second signal terminal, series resonators connected to the signal line in series, and a parallel resonator connected to the signal line in parallel. The series resonators include first and second series resonators each of which has an IDT electrode and a dielectric film covering the IDT electrode, the first series resonator being configured to have an anti-resonant frequency closer to a passband of the elastic wave filter than that of the second series resonator, and a dielectric film covering the first series resonator being configured to have a film thickness greater than that of a dielectric film covering the second series resonator.

Various embodiments of the elastic wave device may include any one or more of the following features.

In one embodiment, an elastic wave filter comprises a substrate, a signal line disposed on the substrate and connecting a first signal terminal to a second signal terminal, at least one series resonator connected to the signal line in series between the first and second signal terminals, and a plurality of parallel resonators connected in parallel between the signal line and at least one ground terminal. The plurality of parallel resonators include first and second parallel resonators each having an interdigital transducer (IDT) electrode and a dielectric film covering the IDT electrode, the first parallel resonator having a resonant frequency closer to a passband of the elastic wave filter than a resonant frequency of the second parallel resonator, and the dielectric film covering the IDT electrode of the first parallel resonator having a film thickness greater than a film thickness of the dielectric film covering the IDT electrode of the second parallel resonator.

In one example the first parallel resonator includes two first parallel resonators. In one example one of the two first parallel resonators has a resonant frequency closest to the passband of the elastic wave filter among the plurality of parallel resonators, and the other of the two first parallel resonators has a resonant frequency second closest to the passband of the elastic wave filter among the plurality of parallel resonators.

The substrate can be a lithium niobate piezoelectric substrate, for example. In one example the lithium niobate piezoelectric substrate has Euler angles ($\phi$, $\theta$, $\psi$) satisfying $-5°\leq\phi\leq5°$, $213°\leq\theta\leq223°$, and $-5°\leq\psi\leq5°$.

In one example the film thickness of the dielectric film covering the IDT electrode of the first parallel resonator is approximately 1850 nm, and the film thickness of the dielectric film covering the IDT electrode of the second parallel resonator is approximately 1600 nm.

In another example the at least one series resonator includes first and second series resonators each having an IDT electrode and a dielectric film covering the IDT electrode, the first series resonator having an anti-resonant frequency closer to the passband of the elastic wave filter than an anti-resonant frequency of the second series resonator, and the dielectric film covering the IDT electrode of the first series resonator has a film thickness greater than a film thickness of the dielectric film covering the IDT electrode of the second series resonator. In another example the at least one series resonator includes a plurality of series resonators each having an IDT electrode and a dielectric film covering the IDT electrode, a first series resonator of the plurality of series resonators having an anti-resonant frequency closest to the passband of the elastic wave filter among the plurality of series resonators, and the dielectric film covering the IDT electrode of the first series resonator being thicker than the dielectric film covering the IDT electrodes of the others of the plurality of series resonators.

According to another embodiment, an elastic wave filter comprises a substrate, a signal line disposed on the substrate and connecting a first signal terminal to a second signal terminal, at least one parallel resonator connected in parallel between the signal line and at least one ground terminal, and a plurality of series resonators connected to the signal line in series between the first and second signal terminals. The plurality of series resonators includes first and second series resonators each having an IDT electrode and a dielectric film covering the IDT electrode, the first series resonator having an anti-resonant frequency closer to a passband of the elastic wave filter than an anti-resonant frequency of the second series resonator, and a dielectric film covering the IDT electrode of the first series resonator having a film thickness greater than a film thickness of the dielectric film covering the IDT electrode of the second series resonator.

The substrate can be a lithium niobate piezoelectric substrate, for example. In one example the lithium niobate piezoelectric substrate has Euler angles ($\phi$, $\theta$, $\psi$) satisfying $-5° \leq \phi \leq 5°$, $213° \leq \theta \leq 223°$, and $-5° \leq \psi \leq 5°$.

In one example the at least one parallel resonator includes first and second parallel resonators each having an IDT electrode and a dielectric film covering the IDT electrode, the first parallel resonator having a resonant frequency closer to the passband of the elastic wave filter than a resonant frequency of the second parallel resonator, and the dielectric film covering the IDT electrode of the first parallel resonator having a film thickness greater than a film thickness of the dielectric film covering the IDT electrode of the second parallel resonator. In another example the at least one parallel resonator includes a plurality of parallel resonators each having an IDT electrode and a dielectric film covering the IDT electrode, a first parallel resonator of the plurality parallel resonators having a resonant frequency closest to the passband of the elastic wave filter among the plurality of parallel resonators, and the dielectric film covering the IDT electrode of the first parallel resonator having a first film thickness that is greater than a film thickness of the dielectric film covering the IDT electrodes of the others of the plurality of parallel resonators. The plurality of parallel resonators may further include a second parallel resonator having a resonant frequency second closest to the passband of the elastic wave filter among the plurality of parallel resonators, and the dielectric film covering the IDT electrode of the second parallel resonator having the first film thickness.

In one example the film thickness of the dielectric film covering the IDT electrode of the first series resonator is approximately 1850 nm, and the film thickness of the dielectric film covering the IDT electrode of the second series resonator is approximately 1600 nm.

According to another embodiment, an elastic wave filter comprises a substrate, a signal line disposed on the substrate and connecting a first signal terminal to a second signal terminal, a plurality of series resonators connected to the signal line in series between the first and second signal terminals, and a plurality of parallel resonators connected in parallel between the signal line and at least one ground terminal, the plurality of parallel resonators and the plurality of series resonators together forming a ladder circuit. Each of the plurality of series resonators has a first interdigital transducer (IDT) electrode and a first dielectric film covering the first IDT electrode. The plurality of series resonators includes a first series resonator having an anti-resonant frequency closest to a passband of the elastic wave filter among the plurality of series resonators, the first dielectric film covering the first IDT electrode of the first series resonator having a thickest first film thickness among the plurality of series resonators. Each of the plurality of parallel resonators has a second IDT electrode and a second dielectric film covering the second IDT electrode. The plurality of parallel resonators includes a first parallel resonator having a resonant frequency closest to the passband of the elastic wave filter among the plurality of parallel resonators, the second dielectric film covering the second IDT electrode of the first parallel resonator having a thickest second film thickness among the plurality of parallel resonators.

Additional aspects and embodiments are directed to providing an antenna duplexer using examples of such elastic wave filters, as well as a module and a communication device using the same.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and the like are intended for convenience of description, not to limit the present systems and methods or their components to any one positional or spatial orientation. In particular, terms indicating directions such as "above," "below," "upper surface," "lower surface" and the like are used for designating relative directions depending only on a relative positional relationship between components included in the elastic wave device such as a substrate, an IDT electrode and the like, and therefore are not intended to designate absolute directions such as a vertical direction and the like.

Figure 1:
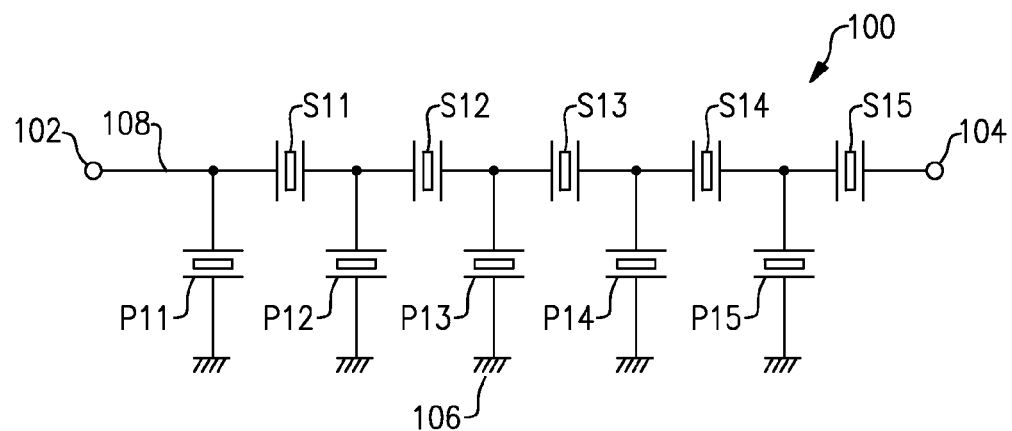
FIG. 1 is a circuit diagram of one embodiment of an elastic wave filter according to aspects of the present invention.
Figure 2:
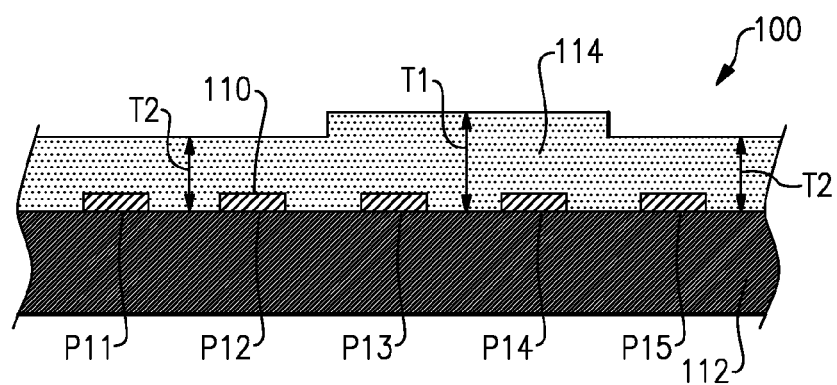
FIG. 2 is a partial cross-sectional view of the elastic wave filter of FIG. 1.
Figure 3:
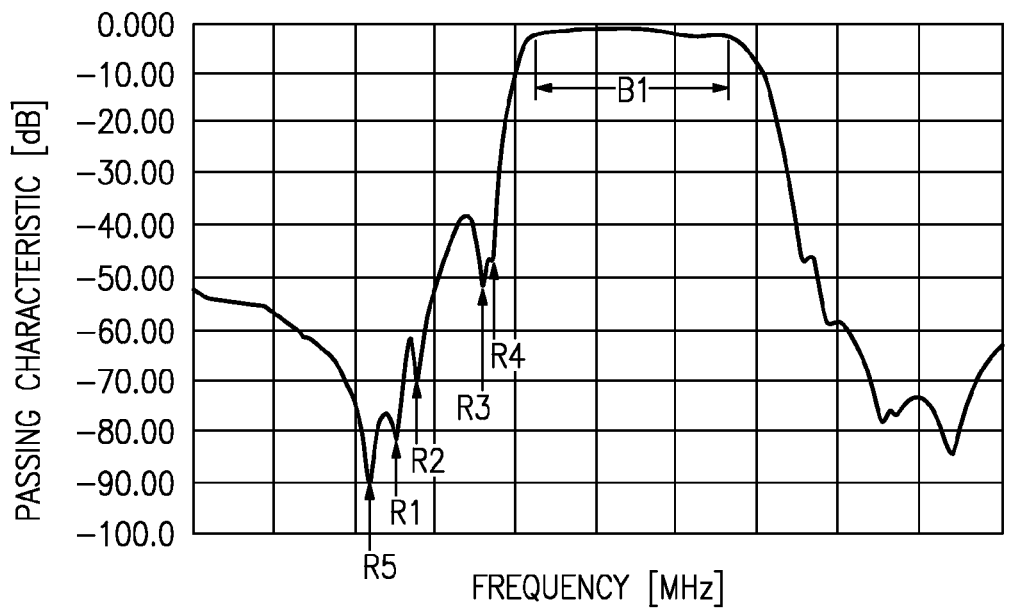
FIG. 3 is a passing characteristic diagram of an example of the elastic wave filter of FIGS. 1 and 2, according to aspects of the present invention.

FIG. 1 illustrates a circuit diagram of an elastic wave filter 100 according to one embodiment. FIG. 2 shows a partial cross-sectional view of the elastic wave filter 100. As shown in FIGS. 1 and 2, the elastic wave filter 100 includes a first signal terminal 102, a second signal terminal 104 and at least one ground terminal 106. There is a signal line 108 connected between the first signal terminal 102 and the second signal terminal 104. A plurality of series resonators S11, S12, S13, S14, and S15 are connected to the signal line 108 in series. A plurality of parallel resonators P11, P12, P13, P14, and P15 are respectively connected between the signal line 108 and the ground terminal 106. Each of the series resonators S11-S15 and the parallel resonators P11-P15 is an elastic surface wave resonator including an interdigital transducer electrode (IDT electrode) 110 provided above a substrate 112 and a dielectric 114 covering the IDT electrode 110. The series resonators S11-S15 and the parallel resonators P11-P15 may form a ladder-type filter having a passband B1 (FIG. 3). As used herein, the passband designates a range of frequencies within which a desired frequency signal can pass through a filter circuit with no attenuation. In an antenna duplexer for Universal Mobile Telecommunications System (UMTS) Band 8, the transmission filter and the reception filter are standardized having passbands of 880-915 MHz and 925-960 MHz respectively. Various examples of the elastic wave filter according to embodiments disclosed herein may correspond to the transmission filter and/or the reception filter for an antenna duplexer, as discussed further below.

In certain examples the substrate 112 is a piezoelectric substrate made of lithium niobate single crystal, the cut angles of which are $-5°≤\phi≤5°$, $213°≤\theta≤223°$ and $-5°≤\psi≤5°$ as represented by the Euler angles ($\phi$, $\theta$, $\psi$). The IDT electrode 110 is made, for example, of a thin film including a metal such as aluminum, molybdenum and the like. In one example the dielectric 114 is made of silicon dioxide. Thermal expansion of the substrate 112 can be suppressed by providing the dielectric 114 having a thermal expansion coefficient that is less than that of the substrate 112. As a result, frequency characteristic fluctuations of the elastic wave filter 100 due to temperature changes can also be suppressed. As shown in FIG. 2, in one example the dielectric 114 covering the IDT electrodes 110 of the parallel resonators P11-P15 has a varying film thickness. In particular, the portion of the dielectric 114 covering the parallel resonators P13 and P14 has a first film thickness T1, whereas the portion of the dielectric 114 covering the remaining parallel resonators P11, P12, and P15 has a second film thickness T2. In one example the film thickness T1 is greater than the film thickness T2. In one example the film thickness T1 is approximately 1850 nm, whereas the film thickness T2 is approximately 1600 nm.

FIG. 3 shows a passing characteristic of one example of the elastic wave filter 100. As shown in FIG. 3, the horizontal axis designates frequency (MHz) and the vertical axis designates insertion loss (in dB), which is sometimes referred to as the passing characteristic. The passband is designated as B1, and the resonant frequencies of the parallel resonators P11, P12, P13, P14, and P15 are designated as R1, R2, R3, R4, and R5 respectively.

If the entire film thickness of the dielectric 114 is great enough to reduce frequency characteristic fluctuations of the parallel resonators P11-P15 due to temperature changes, then fluctuations in a passing characteristic of the elastic wave filter 100 due to the temperature changes are reduced. However, an electromechanical coupling coefficient of the parallel resonators P11-P15 is lowered by greater film thicknesses, and as a result, the passband B1 of the elastic wave filter 100 is narrowed. Conversely, if the entire film thickness of the dielectric 114 is sufficiently thin to increase the electromechanical coupling coefficient of the parallel resonators P11-P15, the passband B1 of the elastic wave filter 100 is broader, but frequency characteristic fluctuations of the parallel resonators P11-P15 due to the temperature changes increase, and therefore fluctuations in the frequency characteristics of the elastic wave filter 100 due to the temperature changes are increased.

Aspects and embodiments are directed to finding a balance between these competing conditions so as to achieve an elastic wave filter with both a sufficiently broad passband B1 and reduced sensitivity to temperature changes. According to certain embodiments, this is achieved at least in part by varying the thickness of the dielectric 114, as shown for example in FIG. 2, and selectively making the film thickness greater over certain parallel resonators than over others.

In the example of the elastic wave filter 100 corresponding to FIG. 3, the parallel resonators P13 and P14 (referred to as "first parallel resonators") have resonant frequencies that are relatively closer to the passband B1 than are the resonant frequencies of the other parallel resonators P11, P12, and P15 (referred to as "second parallel resonators"). In one example, the film thickness T1 of the portion of the dielectric 114 covering the first parallel resonators is configured to be greater than the film thickness T2 of the portion of the dielectric 114 covering the second parallel resonators, the resonant frequencies of which are relatively farther from the passband B1. With this configuration, the thicker dielectric 114 over the first parallel resonators (the resonant frequencies of which are relatively closer to the passband B1) reduces frequency fluctuations due to the temperature changes of these parallel resonators that especially contribute to the formation of the passband B1. As a result, fluctuations in the passband B1 of the elastic wave filter 100 due to the temperature changes can also be suppressed.

Further, because the film thickness T2 of the dielectric 114 covering the second parallel resonators (P11, P12, and P15 in the illustrated example), the resonant frequencies of which are relatively farther from the passband B1, is configured to be relatively less, the electromechanical coupling coefficient of the elastic wave filter 100 can be increased. As a result, the elastic wave filter 100 may have a broader passband than if the film thickness of the entire dielectric 114 were equal to T2.

Thus, as described above, in the elastic wave filter 100, the film thickness T1 of the portion of the dielectric 114 covering the first parallel resonators P13, P14, the resonant frequencies of which are relatively closer to the passband B1, is configured to be greater than the film thickness T2 of the portion of the dielectric 114 covering the second parallel resonators P11, P12, P15, the resonant frequencies of which are relatively farther from the passband B1, so that the fluctuations in the passband B1 due to the temperature changes can be suppressed and the elastic wave filter 100 can have a broader passband.

According to certain aspects, it is when the parallel resonator P14 has a resonant frequency closest to the passband B1 that having the thicker dielectric 114 over the first parallel resonators (the resonant frequencies of which are relatively closer to the passband B1) may most effectively suppress the fluctuations in the passband B1 due to temperature changes. Further, when parallel resonator P14 has a resonant frequency closest to the passband B1 and parallel resonator P13 has a resonant frequency second closest to the passband B1, having the thicker dielectric 114 over the first parallel resonators (i.e., those resonators having a resonant frequency closest to the passband) may achieve the greatest effect.

Further, as discussed above, relatively reducing the film thickness of the portion of the dielectric 114 covering all the parallel resonators P11, P12, P15 except the first parallel resonators (P13 and P14) may increase the electromechanical coupling coefficient of the elastic wave filter 100 so that the elastic wave filter 100 can have a broader passband.

In certain examples the substrate 112 is made of a lithium niobate piezoelectric substrate. According to certain aspects, it is when the cut angles of this substrate 112 are $-5°≤\phi≤5°$, $213°≤\theta≤223°$ and $-5°≤\psi≤5°$ as represented by the Euler angles ($\phi$, $\theta$, $\psi$) that an especially great effect may be achieved by the arrangement discussed above. However, other cut angles may also provide the above-described effect. Further, the effect may also be achieved when the substrate 112 is made of lithium tantalate. As will be appreciated by those skilled in the art, given the benefit of this disclosure, the above-described effect may be achieved under the conditions that the thermal expansion coefficient of the dielectric 114 is less than that of the substrate 112 and that the thinner the film thickness of the dielectric 114 becomes, the greater becomes the electromechanical coupling coefficient.

Figure 4:
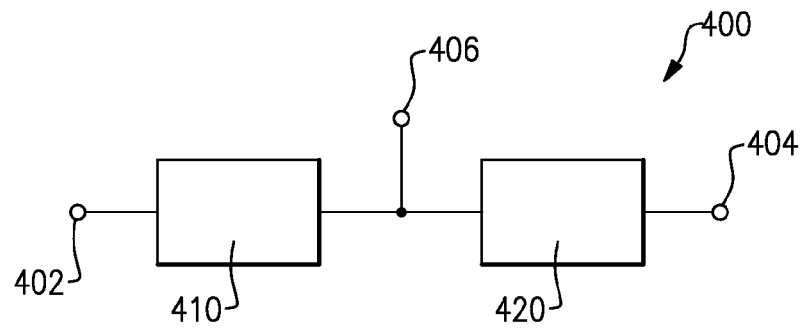
FIG. 4 is a block diagram of a duplexer which may include an elastic wave filter according aspects of the present invention.

FIG. 4 is a block diagram of one example of a duplexer 400 which may include one or more examples of the elastic wave filter 100. As shown in FIG. 4, the duplexer 400 includes a transmission terminal 402, a reception terminal 404, and an antenna terminal 406. The duplexer further includes a transmission filter 410 and a reception filter 420.

In one embodiment, the transmission filter 410 includes the elastic wave filter 100. Using the elastic wave filter 100 as the transmission filter 410 in the duplexer 400 may suppress frequency fluctuations due to temperature changes and ensure a certain value of electromechanical coupling coefficient so that a broadband transmission filter characteristic can be realized.

In another embodiment, the duplexer 400 may use the elastic wave filter 100 as the reception filter 420. Using the elastic wave filter 100 as the reception filter 420 in the duplexer 400 may suppress frequency fluctuations due to temperature changes and may ensure a certain value of electromechanical coupling coefficient so that a broadband reception filter characteristic can be realized.

In other embodiments of the duplexer 400, both the transmission filter 410 and the reception filter 420 can incorporate the elastic wave filter 100.

Figure 5:
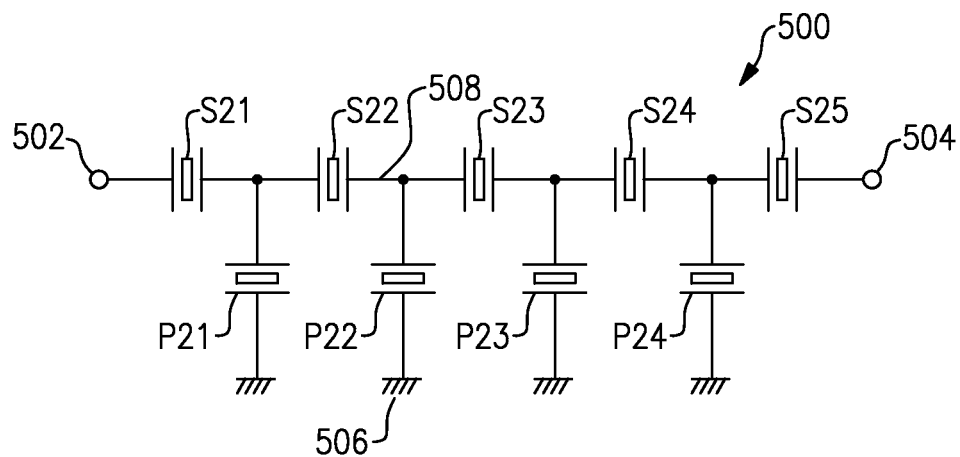
FIG. 5 is a circuit diagram of another embodiment of an elastic wave filter according to aspects of the present invention.
Figure 6:
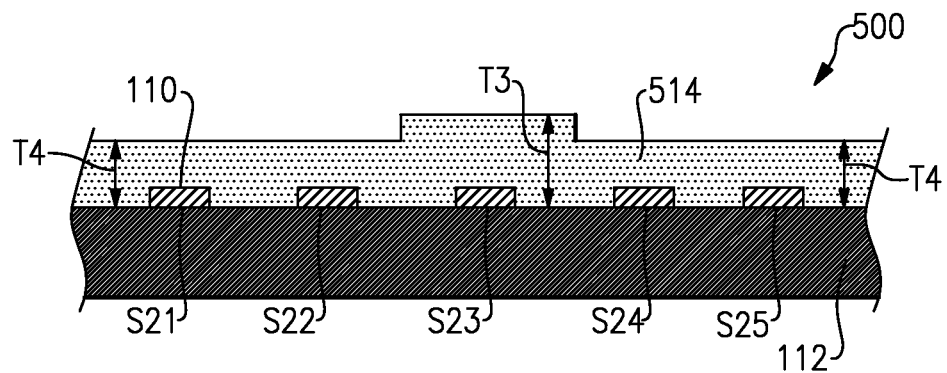
FIG. 6 is a partial cross-sectional view of the elastic wave filter of FIG. 5.

FIG. 5 is a circuit diagram of an elastic wave filter 500 according to another embodiment. FIG. 6 illustrates a partial cross-sectional view of the elastic wave filter 500.

As shown in FIGS. 5 and 6, the elastic wave filter 500 includes a first signal terminal 502, a second signal terminal 504 and at least one ground terminal 506. There is a signal line 508 connected between the first signal terminal 502 and the second signal terminal 504. A plurality of series resonators S21, S22, S23, S24, S25 are connected to the signal line 508 in series. Parallel resonators P21, P22, P23, P24 are respectively connected between the signal line 508 and the ground terminal 506. Each of the series resonators S21-S25 and the parallel resonators P21-P24 is an elastic surface wave resonator including an IDT electrode 110 provided above the substrate 112. A dielectric 514 is provided covering the IDT electrodes 110. The series resonators S21-S25 and the parallel resonators P21-P24 may form a ladder-type filter having a passband B2 (FIG. 7).

In one example, the dielectric 514 is made of silicon dioxide. As discussed above, where the dielectric 514 has a thermal expansion coefficient that is less than that of substrate 112, it may suppress thermal expansion of the substrate 112 and may therefore suppress frequency characteristic fluctuations of the elastic wave filter 500 due to temperature changes. In the example illustrated in FIG. 6, the dielectric 514 covering the IDT electrode 110 of the series resonators S21-S25 has varying film thicknesses, namely T3 in certain regions and T4 in other regions. In certain examples, as shown in FIG. 6, the film thickness T3 is greater than the film thickness T4. In one example the film thickness T3 is approximately 1850 nm in the series resonator S23, whereas the film thickness T4 is approximately 1600 nm in the series resonators S21, S22, S24, S25.

Figure 7:
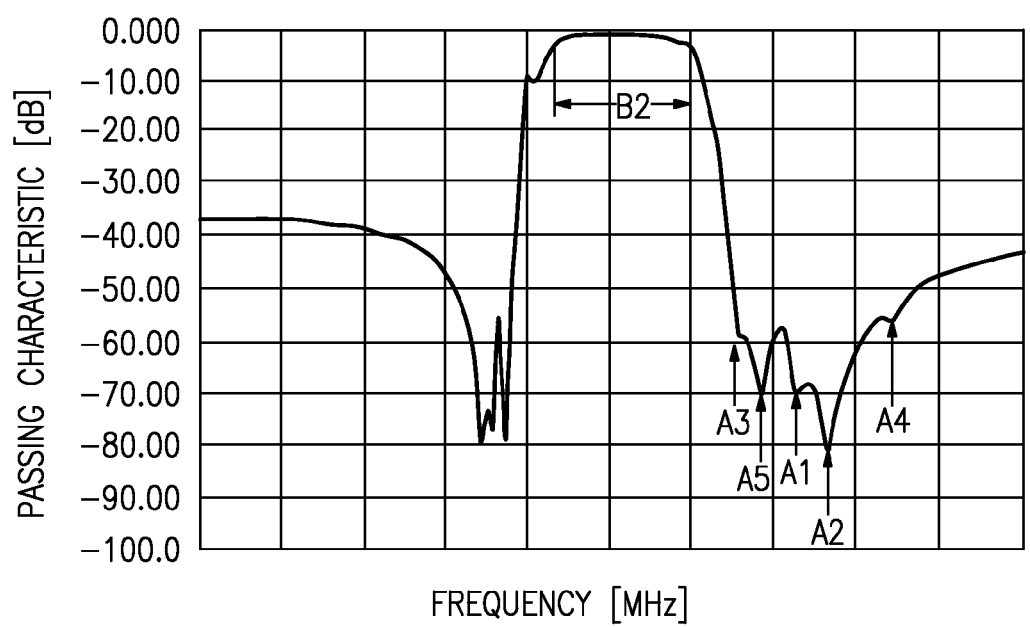
FIG. 7 is a passing characteristic diagram of an example of the elastic wave filter of FIGS. 5 and 6, according to aspects of the present invention.

FIG. 7 shows a passing characteristic of one example of the elastic wave filter 500. As shown in FIG. 7, the horizontal axis designates frequency (MHz) and the vertical axis designates insertion loss (in dB), which is sometimes referred to as the passing characteristic. The passband is designated as B2, and the anti-resonant frequencies of the series resonators S21, S22, S23, S24, S25 are designated as A1, A2, A3, A4, A5 respectively.

Similar to the situation discussed above, if the entire film thickness of the dielectric 514 covering the series resonators S21-S25 is great enough to reduce the frequency characteristic fluctuations of the series resonators S21-S25 due to temperature changes, the fluctuations in the passing characteristic of the elastic wave filter 500 due to the temperature changes are reduced. However, an electromechanical coupling coefficient of the series resonators S21-S25 is lowered by greater film thicknesses, and as a result, the passband B2 of the elastic wave filter 500 is narrowed. Conversely, if the entire film thickness of the dielectric 514 is sufficiently thin to increase the electromechanical coupling coefficient of the series resonators S21-S25, the passband B2 of the elastic wave filter 500 is broader, but frequency characteristic fluctuations of the series resonators S21-S25 due to the temperature changes increase, and therefore fluctuations in the frequency characteristics of the elastic wave filter 500 due to the temperature changes are increased.

Accordingly, to provide a solution, the dielectric 514 of the elastic wave filter 500 has varying film thicknesses. In particular, the film thickness T3 of the portion of the dielectric 514 covering the series resonator S23 (referred to as the first series resonator), the anti-resonant frequency of which is relatively closer to the passband B2 (A3 in FIG. 7), is configured to be greater than the film thickness T4 of the portion of the dielectric 514 covering the other series resonators S21, S22, S24, S25 (referred to as second series resonators). The anti-resonant frequencies of the second series resonators are relatively farther from the passband B2 that that of the first series resonator S23.

Accordingly, because the film thickness T3 of the portion of the dielectric 514 covering the first series resonator S23 (the anti-resonant frequency of which is relatively closer to the passband B2) is configured to be relatively greater, frequency fluctuations due to the temperature changes of the series resonator S23 that especially contributes to the formation of the passband B2 can be reduced. As a result, fluctuations in the passband B2 of the elastic wave filter 500 due to the temperature changes can be suppressed.

Further, because the film thickness T4 of the portion of the dielectric 514 covering the second series resonators S21, 22, S24, S25 (the anti-resonant frequencies of which are relatively farther from the passband B2) is configured to be relatively less, the electromechanical coupling coefficient of the elastic wave filter 500 can be increased. As a result, the elastic wave filter 500 can have a broader passband.

Thus, as described above, in embodiments of the elastic wave filter 500, the film thickness T3 of the portion of the dielectric 514 covering the first series resonator, the anti-resonant frequency of which is relatively closer to the passband B2, is configured to be greater than the film thickness T4 of the portion of the dielectric 514 covering the second series resonators, the anti-resonant frequencies of which are relatively farther from the passband B2, such that fluctuations in the passband B2 due to the temperature changes can be suppressed and the elastic wave filter 500 can have a broader passband.

According to certain examples, it is when the series resonator S23 has an anti-resonant frequency closest to the passband B2 that providing the thicker dielectric 514 over this series resonator may most effectively suppress the fluctuations in the passband B2. Further, when the series resonator S23 has an anti-resonant frequency closest to the passband B2 and the series resonator S25 has an anti-resonant frequency second closest to the passband B2, having the thicker dielectric 514 over one or both of the first series resonators (i.e., those having anti-resonant frequencies closest to the passband B2) may achieve the greatest effect.

Further, relatively reducing the film thickness of portion(s) of the dielectric 514 covering all the series resonators S21, S22, S24, S25 (referred to as second series resonators) except the first series resonator may increase the electromechanical coupling coefficient of the elastic wave filter 500 so that the elastic wave filter 500 is more broadband.

As discussed above, in certain examples the substrate 112 is made a lithium niobate piezoelectric substrate, and it is when the cut angles of the substrate 112 are $-5° \leq \phi \leq 5°$, $213° \leq \theta \leq 223°$ and $-5° \leq \psi \leq 5°$ as represented by the Euler angles ($\phi$, $\theta$, $\psi$) that a particularly significant effect may be achieved. However, other cut angles may provide the effects of increased electromechanical coupling coefficient and reduced sensitivity to temperature changes discussed above. In addition, the effects may also be achieved using a lithium tantalite piezoelectric substrate. As will be appreciated by those skilled in the art, given the benefit of this disclosure, the above-described effects may be achieved under the conditions that the thermal expansion coefficient of the dielectric 514 is less than that of the substrate 112, and that the thinner the film thickness of the dielectric 514, the greater the electromechanical coupling coefficient of the series resonators.

According to certain embodiments, an elastic wave filter 100 or 500 may include both the parallel resonators characterized as described above with reference to FIGS. 1 and 2, and the series resonators characterized as described above with reference to FIGS. 5 and 6. In other words, in the elastic wave filter 500, for example, the film thickness of a portion of dielectric 514 covering first parallel resonators (those having resonant frequencies relatively closer to the passband B2) may be greater than the film thickness of a portion of the dielectric 514 covering second parallel resonators (those having resonant frequencies which are relatively farther from the passband B2), and additionally the film thickness of the portion of the dielectric 514 covering the first series resonator (the anti-resonant frequency of which is relatively closer to the passband B2) may be greater than the film thickness of the portion of the dielectric 514 covering the second series resonators (those having anti-resonant frequencies which are relatively farther from the passband B2). A similar arrangement may be implemented in embodiments of the elastic wave filter 100. With these arrangements, fluctuations in the passbands B1 or B2 due to temperature changes may be more effectively suppressed, and the passbands can be broader.

Embodiments of the elastic wave filter 500 may be used as either the transmission filter 410 or the reception filter 420, or both, in the duplexer 400 illustrated in FIG. 4. Using the elastic wave filter 500 as the transmission filter 410 in the duplexer 400 may suppress frequency fluctuations due to temperature changes and ensure a certain value of electromechanical coupling coefficient so that a broadband transmission filter characteristic can be realized. Similarly, using the elastic wave filter 500 as the reception filter 420 in the duplexer 400 may suppress frequency fluctuations due to temperature changes and may ensure a certain value of electromechanical coupling coefficient so that a broadband reception filter characteristic can be realized.

Embodiments and examples of the above-discussed elastic wave filters may be used in a variety of components, such as, but not limited to, antenna duplexers (e.g., duplexer 400, as discussed above), modules, and communication devices. It will be appreciated by those skilled in the art, given the benefit of this disclosure, that configuring a module or communication device to use embodiments of the elastic wave filters or duplexer according to the present embodiments can realize a module and/or communication device having improved characteristics and/or performance.

Figure 8:
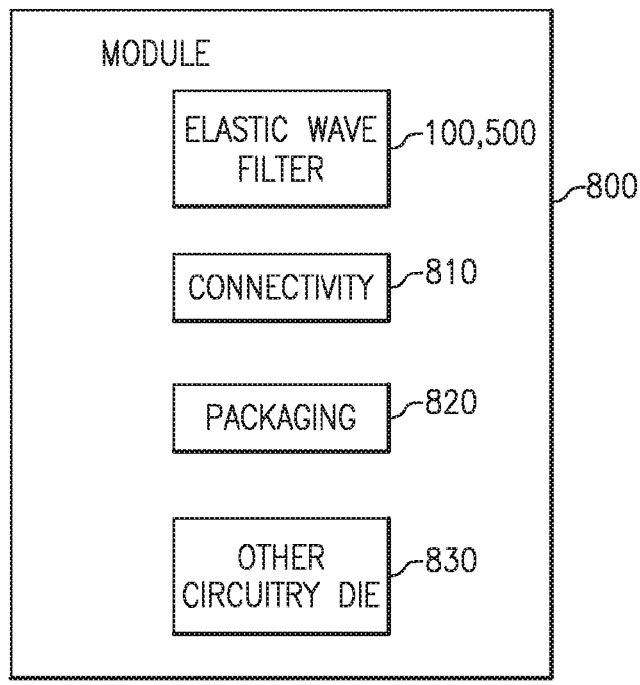
FIG. 8 is a block diagram of one example of a module incorporating an elastic wave filter according to aspects of the present invention.

FIG. 8 is a block diagram illustrating one example of an elastic wave filter module 800 including an elastic wave filter 100 or 500. The module 800 further includes connectivity 810 to provide signal interconnections, packaging 820, such as for example, a package substrate, for packaging of the circuitry, and other circuitry die 830, such as, for example amplifiers, pre-filters, modulators, demodulators, down converters, and the like, as would be known to one of skill in the art of semiconductor fabrication in view of the disclosure herein. In certain embodiments, the elastic wave filter 100 or 500 in module 800 may be replaced with the antenna duplexer 400 (which includes one or more embodiments of the elastic wave filters), so as to provide an RF module, for example.

Figure 9:
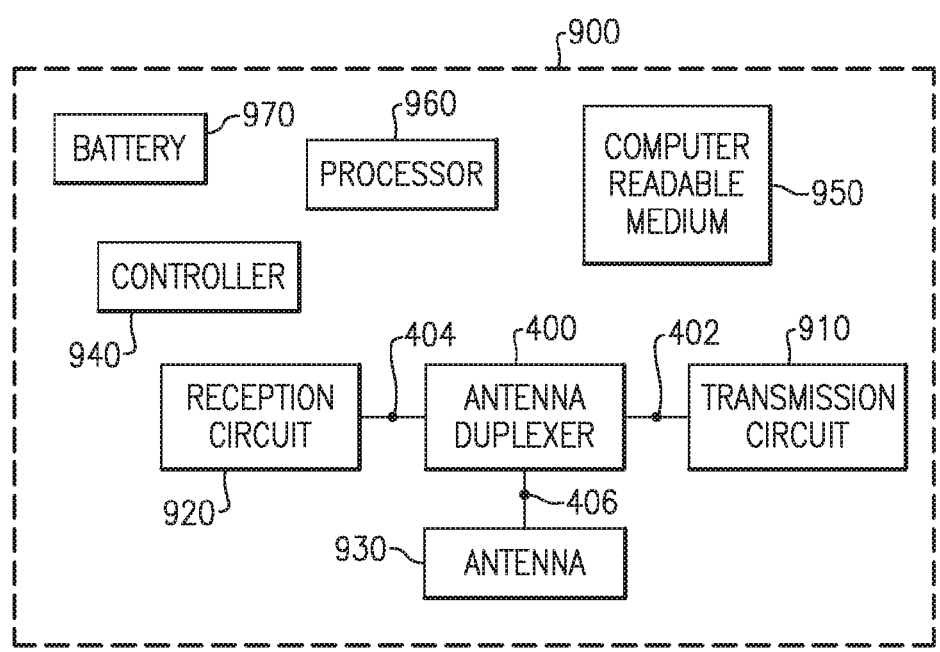
FIG. 9 is a block diagram of one example of a communications device incorporating the antenna duplexer of FIG. 4, according aspects of the present invention.

Still further, configuring a communication device to include the elastic wave filters according to the present embodiments may reduce sensitivity to temperature changes and improve performance characteristics of the communication device. FIG. 9 is a schematic block diagram of one example of a communication device 900 (e.g., a wireless or mobile device) that can include the antenna duplexer 400 incorporating one or more elastic wave filters as discussed above. In certain embodiments, the antenna duplexer 400 can be replaced with, or can include, the module 800. The communication device 900 can represent a multi-band and/or multi-mode device such as a multi-band/multi-mode mobile phone, for example. In certain embodiments, the communication device 900 can include the antenna duplexer 400, a transmission circuit 910 connected to the antenna duplexer via the transmission terminal 402, a reception circuit 920 connected to the antenna duplexer via the reception terminal 404, and an antenna 930 connected to the antenna duplexer via the antenna terminal 406. The transmission circuit 910 and reception circuit 920 may be part of a transceiver that can generate RF signals for transmission via the antenna 930 and can receive incoming RF signals from the antenna 930. The communication device 900 can further include a controller 940, a computer readable medium 950, at least one processor 960, and a battery 970.

It will be understood that various functionalities associated with the transmission and receiving of RF signals can be achieved by one or more components that are represented in FIG. 9 as the transmission circuit 910 and the reception circuit 920. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 9 as the antenna 930. For example, a single antenna can be configured to provide both transmitting and receiving functionalities. In another example, transmitting and receiving functionalities can be provided by separate antennas. In yet another example in which the communication device is a multi-band device, different bands associated with the communication device 900 can be provided with different antennas.

To aid switching between receive and transmit paths, the antenna duplexer 400 can be configured to electrically connect the antenna 930 to a selected transmit or receive path. Thus, the antenna duplexer 400 can provide a number of switching functionalities associated with an operation of the communication device 900. In addition, as discussed above, the antenna duplexer 400 includes the transmission filter 410 and reception filter 420, which are configured to provide filtering of the RF signals. As discussed above, either or both of the transmission filter 410 and reception filter 420 can include embodiments of the elastic wave filters 100, 500, and thereby provide enhanced performance through the benefits of reduced fluctuations in the passing characteristic due to temperature changes and broader band operation (broader passbands B1 and/or B2).

As shown in FIG. 9, in certain embodiments, the controller 940 can be provided for controlling various functionalities associated with operations of the antenna duplexer 400 and/or other operating component(s). In certain embodiments, the at least one processor 960 can be configured to ease implementation of various processes for operation of the communication device 900. The processes performed by the at least one processor 960 may be implemented by computer program instructions. These computer program instructions may be provided to the at least one processor, which can be a general purpose computer, a special purpose computer, or another programmable data processing apparatus, to produce a machine, such that the instructions, which execute via the at least one processor of the computer or other programmable data processing apparatus, create a mechanism for operating the communication device 900. In certain embodiments, these computer program instructions may also be stored in the computer-readable medium 950. The battery 970 can be any suitable battery for use in the communication device 900, including, for example, a lithium-ion battery.

Embodiments of the elastic wave device, and the antenna duplexer, the module, and the communication device using the same, may be useful as components of various electronic devices, such as a cell phone, for example.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An elastic wave filter comprising:
   a substrate;
   a signal line disposed on the substrate and connecting a first signal terminal to a second signal terminal;
   first and second series resonators connected to the signal line in series between the first and second signal terminals, each of the first and second series resonators having an interdigital transducer (IDT) electrode and a dielectric film covering the IDT electrode, the first series resonator having an anti-resonant frequency closer to a passband of the elastic wave filter than an anti-resonant frequency of the second series resonator, and the dielectric film covering the IDT electrode of the first series resonator having a film thickness greater than a film thickness of the dielectric film covering the IDT electrode of the second series resonator; and
   a plurality of parallel resonators connected in parallel between the signal line and at least one ground terminal, the plurality of parallel resonators including first and second parallel resonators each having an IDT electrode and a dielectric film covering the IDT electrode, the first parallel resonator having a resonant frequency closer to a passband of the elastic wave filter than a resonant frequency of the second parallel resonator, and the dielectric film covering the IDT electrode of the first parallel resonator having a film thickness greater than a film thickness of the dielectric film covering the IDT electrode of the second parallel resonator.

2. The elastic wave filter of claim 1 wherein the first parallel resonator includes two first parallel resonators.

3. The elastic wave filter of claim 2 wherein one of the two first parallel resonators has a resonant frequency closest to the passband of the elastic wave filter among the plurality of parallel resonators, and the other of the two first parallel resonators has a resonant frequency second closest to the passband of the elastic wave filter among the plurality of parallel resonators.

4. The elastic wave filter of claim 1 wherein the substrate is a lithium niobate piezoelectric substrate.

5. The elastic wave filter of claim 4 wherein the lithium niobate piezoelectric substrate has Euler angles (φ, θ, ψ) satisfying −5°≤φ≤5°, 213°≤θ≤223°, and −5°≤ψ≤5°.

6. The elastic wave filter of claim 1 wherein the film thickness of the dielectric film covering the IDT electrode of the first parallel resonator is approximately 1850 nm, and the film thickness of the dielectric film covering the IDT electrode of the second parallel resonator is approximately 1600 nm.

7. The elastic wave filter of claim 1 further comprising a third series resonator connected to the signal line in series with the first and second series resonators, the third series resonator having an IDT electrode and a dielectric film covering the IDT electrode, the third series resonator having an anti-resonant frequency closer to the passband of the elastic wave filter than the anti-resonant frequency of the second series resonator, the dielectric film covering the IDT electrode of the third series resonator having a film thickness greater than the film thickness of the dielectric film covering the IDT electrode of the second series resonator.

8. The elastic wave filter of claim 1 wherein the plurality of parallel resonators further includes a third parallel resonator having an IDT electrode and a dielectric film covering the IDT electrode, the third parallel resonator having a resonant frequency closer to the passband of the elastic wave filter than the resonant frequency of the second parallel resonator, and the dielectric film covering the IDT electrode of the third parallel resonator having a film thickness greater than the film thickness of the dielectric film covering the IDT electrode of the second parallel resonator.

9. A module comprising the elastic wave filter of claim 1.

10. A duplexer comprising:
a transmission filter; and
a reception filter, at least one of the reception filter and the transmission filter including the elastic wave filter of claim 1.

11. A module comprising the duplexer of claim 10.

12. A communications device comprising the duplexer of claim 10.

13. An elastic wave filter comprising:
a substrate;
a signal line disposed on the substrate and connecting a first signal terminal to a second signal terminal;
a plurality of parallel resonators connected in parallel between the signal line and at least one ground terminal, each of the plurality of parallel resonators having an interdigital transducer (IDT) electrode and a dielectric film covering the IDT electrode, a first parallel resonator of the plurality of parallel resonators having a resonant frequency closest to the passband of the elastic wave filter among the plurality of parallel resonators, and the dielectric film covering the IDT electrode of the first parallel resonator having a first film thickness greater than a second film thickness of the dielectric film covering the IDT electrode of a second parallel resonator of the plurality of parallel resonators; and
a plurality of series resonators connected to the signal line in series between the first and second signal terminals, the plurality of series resonators including first and second series resonators each having an IDT electrode and a dielectric film covering the IDT electrode, the first series resonator having an anti-resonant frequency closer to a passband of the elastic wave filter than an anti-resonant frequency of the second series resonator, and a dielectric film covering the IDT electrode of the first series resonator having a film thickness greater than a film thickness of the dielectric film covering the IDT electrode of the second series resonator.

14. The elastic wave filter of claim 13 wherein the substrate is a lithium niobate piezoelectric substrate.

15. The elastic wave filter of claim 14 wherein the lithium niobate piezoelectric substrate has Euler angles (φ, θ, ψ) satisfying −5°≤φ≤5°, 213°≤θ≤223°, and −5°≤ψ≤5°.

16. The elastic wave filter of claim 13 wherein the plurality of parallel resonators includes a third parallel resonator having a resonant frequency second closest to the passband of the elastic wave filter among the plurality of parallel resonators, the dielectric film covering the IDT electrode of the third parallel resonator having the first film thickness.

17. The elastic wave filter of claim 13 wherein the film thickness of the dielectric film covering the IDT electrode of the first series resonator is approximately 1850 nm, and the film thickness of the dielectric film covering the IDT electrode of the second series resonator is approximately 1600 nm.

18. An elastic wave filter comprising:
a substrate;
a signal line disposed on the substrate and connecting a first signal terminal to a second signal terminal;
a plurality of series resonators connected to the signal line in series between the first and second signal terminals, each of the plurality of series resonators having a first interdigital transducer (IDT) electrode and a first dielectric film covering the first IDT electrode, the plurality of series resonators including a first series resonator having an anti-resonant frequency closest to a passband of the elastic wave filter among the plurality of series resonators, the first dielectric film covering the first IDT electrode of the first series resonator having a thickest first film thickness among the plurality of series resonators; and
a plurality of parallel resonators connected in parallel between the signal line and at least one ground terminal, the plurality of parallel resonators and the plurality of series resonators together forming a ladder circuit, the plurality of parallel resonators each having a second IDT electrode and a second dielectric film covering the second IDT electrode, the plurality of parallel resonators including a first parallel resonator having a resonant frequency closest to the passband of the elastic wave filter among the plurality of parallel resonators, the second dielectric film covering the second IDT electrode of the first parallel resonator having a thickest second film thickness among the plurality of parallel resonators.

* * * * *

UNITED STATES PATENT AND TRADEMARK OFFICE
CERTIFICATE OF CORRECTION

PATENT NO. : 9,641,151 B2  Page 1 of 1
APPLICATION NO. : 14/810165
DATED : May 2, 2017
INVENTOR(S) : Satoru Ikeuchi It is certified that error appears in the above-identified patent and that said Letters Patent is hereby corrected as shown below:

On the Title Page

(71) Applicant: delete "SKYWORKS FILTER SOLUTIONS JAPAN CO., LTD., Kadoma-shi (JP)" and insert -- SKYWORKS FILTER SOLUTIONS JAPAN CO., LTD., Kadoma-Shi (JP) --

(72) Inventor: delete "Satoru Ikeuchi, Hyogo-ken (JP)" and insert -- Satoru Ikeuchi, Hyogo-Ken (JP) --

Signed and Sealed this
Thirteenth Day of June, 2017

Joseph Matal
*Performing the Functions and Duties of the
Under Secretary of Commerce for Intellectual Property and
Director of the United States Patent and Trademark Office*